(12) United States Patent
Bretschneider

(10) Patent No.: US 7,577,926 B2
(45) Date of Patent: Aug. 18, 2009

(54) SECURITY-SENSITIVE SEMICONDUCTOR PRODUCT, PARTICULARLY A SMART-CARD CHIP

(75) Inventor: Ernst Bretschneider, Erfurt (DE)

(73) Assignee: NXP B.V., Eindhoven (NL)

( * ) Notice: Subject to any disclaimer, the term of this patent is extended or adjusted under 35 U.S.C. 154(b) by 478 days.

(21) Appl. No.: 10/564,079

(22) PCT Filed: Jul. 5, 2004

(86) PCT No.: PCT/IB2004/051117
§ 371 (c)(1),
(2), (4) Date: Jan. 9, 2006

(87) PCT Pub. No.: WO2005/006437
PCT Pub. Date: Jan. 20, 2005

(65) Prior Publication Data
US 2006/0168702 A1     Jul. 27, 2006

(30) Foreign Application Priority Data
Jul. 11, 2003    (EP)   ................................. 03102105

(51) Int. Cl.
*G06F 17/50* (2006.01)
(52) U.S. Cl. .............................. 716/1; 324/763; 324/764
(58) Field of Classification Search ...................... 716/1; 257/642; 324/763, 764
See application file for complete search history.

(56) References Cited
U.S. PATENT DOCUMENTS
5,866,933 A * 2/1999 Baukus et al. ............... 257/368
6,613,661 B1 * 9/2003 Baukus et al. ............... 438/598
2002/0104872 A1 * 8/2002 DeFelice et al. ............. 228/103
2003/0127709 A1 * 7/2003 Lippmann et al. ........... 257/642
2005/0140003 A1 * 6/2005 Wolters et al. .............. 257/737
2007/0030022 A1 * 2/2007 Kash et al. .................. 324/763

FOREIGN PATENT DOCUMENTS
WO    WO 02/43147    5/2002
WO    WO 2004/038800    5/2004

* cited by examiner

Primary Examiner—Jack Chiang
Assistant Examiner—Suchin Parihar

(57) ABSTRACT

To provide a security-sensitive semiconductor product, particularly a smartcard chip, in which are produced not only electrically active structures (2, 3, 4, 5, 6) envisaged by the chip design in the form of circuit functions in and on a wafer (1), which may for example be composed of silicon, but also additional, electrically conductive parts (42, 61, 62) (tiles) of the filling structure, which are insulated from one another, are generated by means of a design program in the remaining residual areas, which greatly impedes, to the reverse engineer the analysis of the security-sensitive circuit structure situated beneath them. The contacts between the parts which are generated, which contacts are for interlinking the latter with the chance signal paths described, may be set "by hand" or by a combination of the design programs in question and a corresponding routing program. The filling conductive parts can also be connected to circuit components, such as transistors, diodes, resistors or capacitors, in order to provide additional circuit functions (e.g. analyzer circuits).

13 Claims, 2 Drawing Sheets

SECURITY-SENSITIVE SEMICONDUCTOR PRODUCT, PARTICULARLY A SMART-CARD CHIP

The invention relates to a security-sensitive semiconductor product, particularly a smart-card chip, in which there are positioned on the semiconductor material not only the active structures envisaged by the chip design, such as transistors, resistors, capacitors, etc., but also additional, electrically inactive, conductive fill structures (tiles) that are generated in the remaining residual areas.

For security-sensitive semiconductor products, such as smart-card chips for example, there is a requirement not only for active protection by means of sensor circuitry and software routines but also for protection against mechanical and optical attack. On each level that is structured, the semiconductor processes required for this call for as even as possible a surface profile and at least a minimum amount of coverage provided by the elements on each level. Given this, it is therefore known for there to be generated not only the electrically active structures envisaged by the chip design, but also, in the remaining residual areas, additional fill structures (tiles), which are not electrically active and are thus not connected to one another electrically either. In this case, some of the electrically active structures envisaged by the chip design, in which structures circuits are produced for example, are introduced into a wafer, which wafer may be composed of silicon, as conductive structures, and some of them are produced on the wafer in the form of additional layers formed by such things as oxides, polycrystalline silicon, metal tracks, and so on. The fill structures (tiles), which are additional to the electrically active structures envisaged by the chip design and are generated in the remaining areas, and which are not electrically active and are thus not connected to one another electrically either, are composed among other things of metal. The fill structures, on a plurality of horizontally extending levels, are insulated by silicon oxides in this case and are arranged at a distance from one another, in which case this distance also exists from the layer composed of polysilicon.

However, some things that have proved to be a disadvantage, particularly for security-sensitive semiconductor products, are that a layout and a connection structure can be analyzed from their planar structure, and that the tiles that are generated in the remaining residual areas do not perform any other functions in the security-sensitive semiconductor products, and thus in the smart-card chips.

It is an object of the invention to provide a security-sensitive semiconductor product, and particularly a smart-card chip, as defined in the preamble to claim 1, which not only greatly impedes any analysis of layout and connection structure from the planar structure but in which additional functions are incorporated by the production of useful additional circuits.

This object is achieved in accordance with the invention by virtue of the fact that, particularly in security-sensitive semiconductor products such as smart-card chips, additional signal paths are produced by the insertion of additional contacts between parts of the fill structures, which fill structures are generated and have previously been electrically insulated, and between these fill structures that are generated and the active elements of the chip design. These additional signal paths in the fill structures are inserted in the existing circuitry of the semiconductor chip between two or more nodes in such a way that one or more closed current paths are produced. The insertion of the additional contacts in the fill structures can be automated by the use of suitable routing programs.

In a further embodiment of the invention, the contacts are to be set in such a way that an arbitrary interlinking of the parts of the fill structures can be performed both horizontal and vertically. What this means is that the contacts are to be set in such a way that there is a change in the wiring level, i.e. in the hierarchy of levels, after each part of the fill structures. However, when the contacts are being set, allowance is at the same time made for the horizontal direction too to change substantially, i.e. as frequently as possible, within each of the parts of the fill structures.

To prevent any optical distinction from being made under the microscope, as many as possible of the fill structures composed of metal that are generated, but not all of them, i.e. substantially the major proportion of the said fill structures, are incorporated in the signal path when the contacts are being set, which means that active, electrically connected parts of the fill structures may even be situated next to parts of the fill structures that, being dummy structure or tiles, are isolated from the active parts of the fill structures that are connected together electrically.

When closed signal paths are created, in the way in which this is done by the invention, by the electrical connection of the fill structures that are generated in modem-day semiconductor processes, all the levels that are to be structured in a chip design, such as diffusion regions, polysilicon structures and metal tracks, can be included in the signal path, the aim being to cause signals to be guided along a path that is as arbitrary as possible.

In accordance with a further feature of the invention, the closed signal path formed by the setting of the contacts that is performed, by which signal path mechanical attack on the surfaces of semiconductors is impeded as a result of the electrical interlinking of the parts of the fill structures on all the structured levels, can also be connected to other, suitable active electronic circuits.

Taking as a point of departure the signal path that is formed in accordance with the invention by interlinking fill structures, the said signal path makes an enormous variety of applications possible. In this way, the signal path that comprises parts of the fill structures that are interlinked with one another can be used as a supply track by connecting electronic circuit components, such as transistors or else diodes, capacitors or opto-electrical components, to the supply voltage via the parts of the fill structures that are interlinked with one another, in which case there is to be a change in the wiring level after each part of the fill structures and also, within each wiring level, as frequent a change as possible in the horizontal direction.

The signal path comprising the parts of the fill structures that are interlinked with one another may, however, also be used as a supply-to-ground path by causing the parts of the fill structures that are interlinked with one another to form an electrically conductive current path between the supply voltage and the ground potential of the electronic circuitry. With this application of the signal path that is created, there may be a pick-off between two at a time of the contacts that are set, which may be fed to electronic analyzer circuits. In this case too there should be a change in the wiring level after each part of the fill structures and the horizontal direction too should change as frequently as possible within each wiring level.

Finally, however, the signal path comprising the parts of the fill structures that are interlinked with one another may also be used as a resistive signal path, in which case the parts of the fill structures that are interlinked with one another are situated between the supply voltage and the ground potential of the electronic circuitry, and resistors, such as, for example, diffusion resistors, are inserted in the resistive signal path at random intervals by means of the contacts that are set. In this case too there may be a pick-off, namely between two resistors at a time, and this too may be fed to electronic analyzer circuits. In this application too of the signal path created by the invention, there should be a change in the wiring level after each part of the fill structures, and the horizontal direction should change as frequently as possible within each wiring level.

Additional functions are thus incorporated in the smart-card chip by the invention, as a result of the production of useful additional circuits.

Any optical tracing of the electronic circuitry of the smart-card chip is very much impeded by the different sizes and positions of the parts of the fill structures that are interlinked with one another.

Other preferred embodiments of the invention will be apparent from the remaining features that are specified in the dependent claims.

These and other aspects of the invention are apparent from and will be elucidated with reference to the embodiments described hereinafter.

IN THE DRAWINGS

Figure 1:
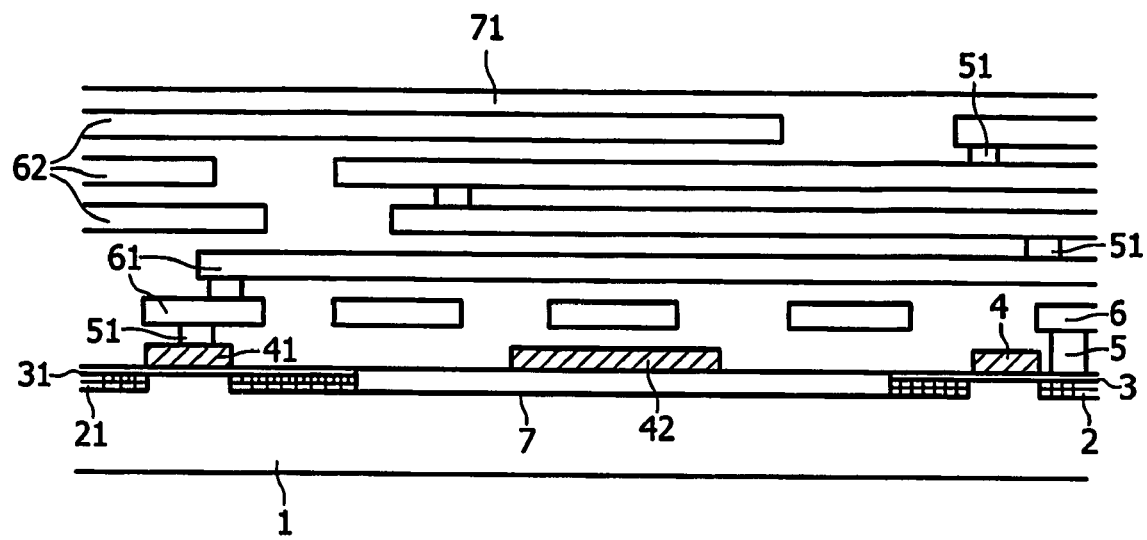
FIG. 1 is a view in section of those parts of the fill structures of a smart card that are interlinked with one another.

FIG. 1 shows, by way of example, a schematic section through a typical semiconductor structure having five metal wiring levels. In this case, some of the active elements of the circuit, such as, for example, transistors, resistors, capacitors, etc., are introduced into a wafer 1, which may be composed of silicon, in the form of conductive layers 2, and some of them are produced on the wafer by means of additional layers, such as oxides 3 and polycrystalline silicon (4). These active elements of the circuitry are connected together by means of contacts 5 and metal tracks 6. In addition to these active structures, small fill structures or tiles 42, 61, 62 have been generated in the remaining residual areas, thus giving on each structured level a substantially uniform surface profile and at least a minimum coverage by the elements on the level. Whereas some 42, 62 of the fill parts that are generated are usually not connected together electrically, a substantial proportion 61 of the fill parts generated are connected together, by additional contacts 51, thus producing a signal path that is connected at one end to the transistor structure 21, 31, 41 via a contact 51. Between the electrically conductive structures, there are insulating layers 7, 71, of silicon oxide, for example. In addition to this, the fill parts, as a result of their positioning and size, to a very large degree prevent the electrical circuitry from being traced optically.

When the contacts 51 are being set, allowance is made for the wiring level to change after each part 61 of the fill structures, and for the horizontal direction too to change as frequently as possible within the level. However, something else for which allowance is made when the contacts 51 are being set is for at least some of the active parts 61 that are electrically connected to one another to be situated next to parts 42, 62 of the fill structures that are not electrically connected to one another, thus making it very difficult for them to be distinguished optically under the microscope.

Figure 2:
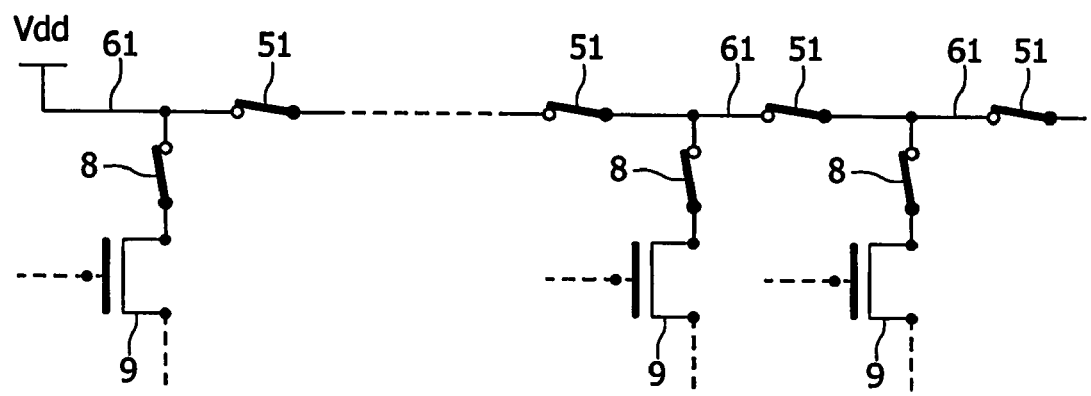
FIG. 2 is a circuit diagram of a signal path that is formed by the parts of the fill structures shown in FIG. 1 and that forms a supply track.

FIG. 2 shows a possible variant way of producing an additional circuit and thus of incorporating an additional function in the smart-card chip shown in FIG. 1, in which the signal path acts as a supply track as a result of the setting of contacts 51 between the parts 61 of the fill structure and the source region of the transistor 9. In this case, the wiring level changes after each part 61 of the fill structures and the horizontal direction changes as frequently as possible within the level.

Figure 3:
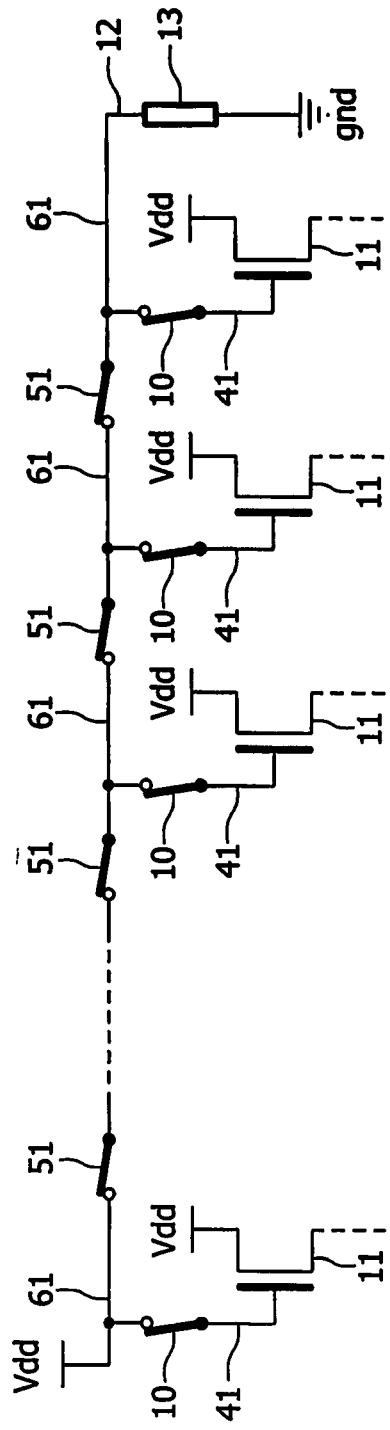
FIG. 3 is a circuit diagram of a signal path that is formed by the parts of the fill structures shown in FIG. 1 and that forms a supply-to-ground path.

A further example of an application is shown in FIG. 3. In this case, parts 61 of the fill structure are connected by means of contacts 51 to form a closed signal path and one end of this path is connected to the supply voltage vdd and the other end, via a resistor, to the ground potential gnd. The electrical potential that forms in the parts 61 is fed to suitable analyzer circuits via further contacts 10. The input to the analyzer circuit is indicated in the Figure by the gate terminal 41 of a pMOS transistor 11. In this application too it is important for the wiring level to change as frequently as possible and for the direction within the level to change as frequently as possible too.

Figure 4:
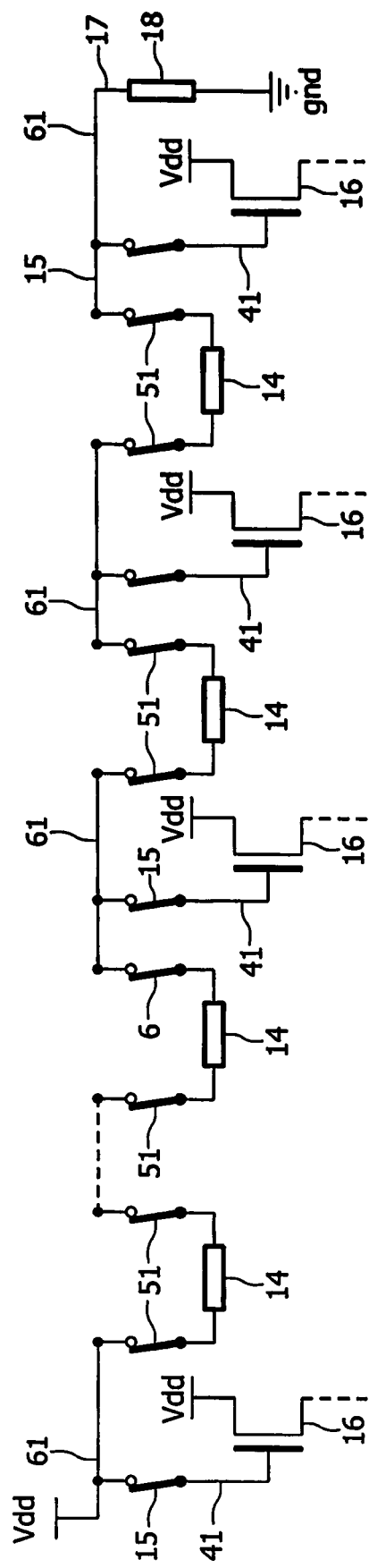
FIG. 4 is a circuit diagram of a signal path that is formed by the parts of the fill structures shown in FIG. 1 and that forms a resistive signal path.

A further variant application of the signal path that, by the setting of contacts 51 in the smart-card chip shown in FIG. 1, was created as a prerequisite for the incorporation of an additional function in the smart-card chip, can be seen from FIG. 4. As shown in this Figure, the signal path acts as a resistive signal path. In this case, parts 61 of the fill structure are once again connected by contacts 51 to form a closed signal path and one end of the path is likewise connected to the supply voltage vdd and the other via a resistor to the ground potential gnd. In addition, resistors 14 are inserted between the metal tracks 61 of the fill structure by means of contacts 51, in which case the resistors may even be diffusion resistors. What is thus formed is a signal path made up of alternating resistors and parts of the fill structure.

In the case of this resistive signal path, there is a potential pick-off between each two resistors by means of further contacts 15. This potential is then once again fed to suitable analyzer circuits—indicated in the present case as pMOS transistors 16—via the contacts 15.

In this application too it is important for the wiring level to change as frequently as possible and for the direction within the level to change as frequently as possible too.

LIST OF REFERENCE NUMERALS

1 Wafer
2 Conductive layer
3 Oxide
4 Polycrystalline silicon, gate terminal
5 Contact
6 Metal track
7 Oxide (insulation)
8 Contact
9 Transistor
10 Contact
11 Transistor
12 Contact
13 Resistor
14 Resistor
15 Contact
16 Transistor
17 Contact
18 Resistor
21 Conductive layer
31 Oxide 41 Polycrystalline silicon, gate terminal
42 Fill part, polycrystalline silicon
51 Contact
61 Fill part, metal
62 Fill part, metal
71 Oxide
gnd Ground potential
vdd Supply voltageH

The invention claimed is:

1. A security-sensitive semiconductor product, particularly a smart-card chip, comprising electrically active structures envisaged by the chip design in the form of circuit functions in and on a wafer and connected by electrical contacts, and an additional filling structure comprising electrically conductive parts, the active structures and the additional filling structure are insulated from one another and wherein the parts of the filling structures that are generated are combined with the contacts so that additional circuit functions are generated in addition to the electrically active circuit structures that are produced for the circuit;

wherein a majority of the fill structures generated are incorporated along a signal path so that active, electrically connected parts of the fill structures are situated next to dummy fill structures that are insulated from the electrically active structures and the active electrically connected parts of the fill structures.

2. A security-sensitive semiconductor product as claimed in claim 1 wherein the parts of the filling structures that are generated are composed of metal, of polycrystalline silicon, of diffusion regions, or of other electrically conductive materials of the semiconductor product.

3. A security-sensitive semiconductor product as claimed in claim 2, wherein the contacts are also set by a routing program belonging to a design program for chip design.

4. A security-sensitive semiconductor product as claimed in claim 1, wherein the fill structures composed of metal are connected together electrically, so that at least one closed signal path is formed between two or more nodes of the active circuitry of the circuit.

5. A security-sensitive semiconductor product as claimed in claim 1, wherein the contacts are set to provide arbitrary interlinkings, both horizontal and vertical, of the parts of the fill structure are produced.

6. A security-sensitive semiconductor product as claimed in claim 5, wherein the contacts are set so that after each part of the fill structure the wiring level is changed and the horizontal direction is changed within the level.

7. A security-sensitive semiconductor product as claimed in claim 1, wherein the signal path is connected to further suitable integrated electronic circuit components including at least one of transistors, diodes, resistors and capacitors.

8. A security-sensitive semiconductor product as claimed in claim 7, wherein the signal path that is composed of parts of the fill structures that are interlinked with one another comprises a supply track by connecting electronic circuit components to the supply voltage via the parts of the fill structures that are interlinked with one another.

9. A security-sensitive semiconductor product as claimed in claim 8, wherein a pick-off fed to electronic analyzer circuits, takes place between two contacts at a time on the signal path.

10. A security sensitive semiconductor product as claimed in claim 9, wherein the pick-off takes place between two resistors at a time.

11. A security-sensitive semiconductor product, particularly a smart-card chip, comprising electrically active structures envisaged by the chip design in the form of circuit functions in and on a wafer and connected by electrical contacts, and an additional filling structure comprising electrically conductive parts, the active structures and the additional filling structure are insulated from one another and wherein the parts of the filling structures that are generated are combined with the contacts so that additional circuit functions are generated in addition to the electrically active circuit structures that are produced for the circuit;

wherein a majority of the fill structures generated are incorporated along a signal path so that active, electrically connected parts of the fill structures are situated next to dummy fill structures that are insulated from the electrically active structures and the active electrically connected parts of the fill structures;

wherein the signal path is connected to further suitable integrated electronic circuit components including at least one of transistors, diodes, resistors and capacitors; and wherein the signal path that is composed of parts of the fill structures that are interlinked with one another is used as a supply-to-ground path by causing the parts of the fill structures that are interlinked with one another to form an electrically conductive current path between the supply voltage and the ground potential of the electronic circuitry.

12. A security-sensitive semiconductor product as claimed in claim 11, wherein the signal path that is composed of parts of the fill structures that are interlinked with one another is used as a resistive signal path, in which case the parts of the fill structures that are interlinked with one another are connected between the supply voltage and the ground potential of the electronic circuitry and semiconductor resistors are inserted in the resistive signal path at random intervals by means of contacts that are set.

13. A security-sensitive semiconductor product as claimed in claim 12, comprising security means for impeding optical tracing of the electronic circuitry of security-sensitive semiconductor products by varying sizes and/or positions of the interlinked parts of the fill structures.

* * * * *